United States Patent [19]
Goldstein et al.

[11] 4,393,348
[45] Jul. 12, 1983

[54] METHOD AND APPARATUS FOR DETERMINING MINORITY CARRIER DIFFUSION LENGTH IN SEMICONDUCTORS

[75] Inventors: Bernard Goldstein; Joseph Dresner, both of Princeton; Daniel J. Szostak, Mercerville, all of N.J.

[73] Assignee: RCA Corporation, New York, N.Y.

[21] Appl. No.: 228,575

[22] Filed: Jan. 26, 1981

[51] Int. Cl.³ .......................................... G01R 31/26
[52] U.S. Cl. ............................ 324/158 R; 324/158 D
[58] Field of Search ........... 324/158 R, 158 D, 158 T, 324/73 R

[56] References Cited

U.S. PATENT DOCUMENTS 4,333,051 6/1982 Goodman ..................... 324/158 R

OTHER PUBLICATIONS

Ashcroft, N. W. et al.; Solid State Physics; Holt, Rinehart and Winston; New York; 1976; pp. 360-362.

*Primary Examiner*—Ernest F. Karlsen
*Attorney, Agent, or Firm*—Birgit E. Morris; Donald S. Cohen; Joseph D. Lazar

[57] ABSTRACT

Method and apparatus are provided for determining the diffusion length of minority carriers in semiconductor material, particularly amorphous silicon which has a significantly small minority carrier diffusion length using the constant-magnitude surface-photovoltage (SPV) method. An unmodulated illumination provides the light excitation on the surface of the material to generate the SPV. A manually controlled or automatic servo system maintains a constant predetermined value of the SPV. A vibrating Kelvin method-type probe electrode couples the SPV to a measurement system. The operating optical wavelength of an adjustable monochromator to compensate for the wavelength dependent sensitivity of a photodetector is selected to measure the illumination intensity (photon flux) on the silicon. Measurements of the relative photon flux for a plurality of wavelengths are plotted against the reciprocal of the optical absorption coefficient of the material. A linear plot of the data points is extrapolated to zero intensity. The negative intercept value on the reciprocal optical coefficient axis of the extrapolated linear plot is the diffusion length of the minority carriers.

13 Claims, 5 Drawing Figures

METHOD AND APPARATUS FOR DETERMINING MINORITY CARRIER DIFFUSION LENGTH IN SEMICONDUCTORS

BACKGROUND OF THE INVENTION

The Government of the United States of America has rights in this invention pursuant to Subcontract No. XJ-9-8254-1 awarded by the Department of Energy.

This invention relates to an apparatus for determining the minority carrier diffusion length in semiconductors using the constant-magnitude surface-photovoltage (SPV) method.

Apparatus and methods for determining the minority carrier diffusion length (L) using the SPV method are well known. In brief, the principle of the diffusion length (L) determination requires the illumination of a specimen surface with monochromatic radiation of energy slightly greater than the bandgap of the semiconductor. Electron-hole pairs are produced and diffuse to the illuminated (front) surface where they are separated by the electric field of the depletion region (i.e., the surface-space-charge region) to produce a surface photovoltage (SPV). A portion of the SPV signal is coupled to an amplifier for amplification and measurement. The photon intensity (photons per second) is adjusted to produce the same magnitude of SPV at various wavelengths of illumination. The photon intensity required to produce this constant magnitude SPV signal is conveniently plotted on the ordinate against the reciprocal of the absorption coefficient on the abscissa for each wavelength. The resultant plot is linear and is extrapolated to the zero intensity intercept on the negative abscissa. This intercept value is the effective diffusion length (L). For a more detailed description of the theory and background for this method, see an article "A Method for the Measurement of Short Minority Carrier Diffusion Lengths in Semiconductors," by A. M. Goodman in the *Journal of Applied Physics,* Vol. 32, No. 12, pp. 2550-2552, December 1961. The American Society for Testing and Materials has adopted a standard using this method which is published as ASTM F 291-78. The ASTM standard, when implemented according to the block diagram of FIG. 1 of ASTM F 291-78, is provided particularly for testing the diffusion length (L) for minority carriers in silicon but the method in general may be used for other semiconductor materials.

See U.S. patent application, entitled "Method and Apparatus for Determining Minority Carrier Diffusion Length in Semiconductors", Ser. No. 153,920, filed on May 28, 1980 by A. M. Goodman now U.S. Pat. No. 4,333,501, issued June 1, 1972, for a description of an apparatus using this principle in which a servo system maintains a constant predetermined value of the SPV, thereby allowing the measurements to be carried out in a relatively short time. This minimizes the effects of drift caused by laterially diffusing minority carriers during a test. Moreover, this Goodman application describes a capacitance-pickup electrode which is placed to make physical contact with the surface of a semiconductor material to sense SPV test signals. The SPV method uses a surface junction to effect what may be termed "band-bending" to collect minority carriers generated at various depths by monochromatic light of varying absorption coefficient. In such SPV methods, as described in the Goodman patent application, the exciting light is chopped or modulated in order to develop a.c. components of the SPV pickup or detection by a capacitance pickup or probe. The Goodman method however is not suitable for measuring the significantly small diffusion length of amorphous silicon which is known to exhibit very slow transients in SPV generated by chopped or modulated light.

Another conventional method for measuring the minority carrier diffusion length (L) of semiconductor material involves measuring a certain distance on the semiconductor which distance is on the order of the length L. See J. N. Shive, "Properties, Physics and Design of Semiconductor Devices," Van Nostrand, N.Y. 1959, p. 337, for a description of this method. This measurement is very difficult to use for amorphous silicon because L is about or less than a few thousand angstroms, i.e. 2-3 $\mu$m.

SUMMARY OF THE INVENTION

According to the present invention, the diffusion length (L) of minority carriers of amorphous silicon is determined by illuminating the surface of the silicon with steady (d.c.) light and measuring the surface potential (SPV) with a non-contacting vibrating Kelvin probe.

DETAILED DESCRIPTION OF A PREFERRED EMBODIMENT

Figure 2:
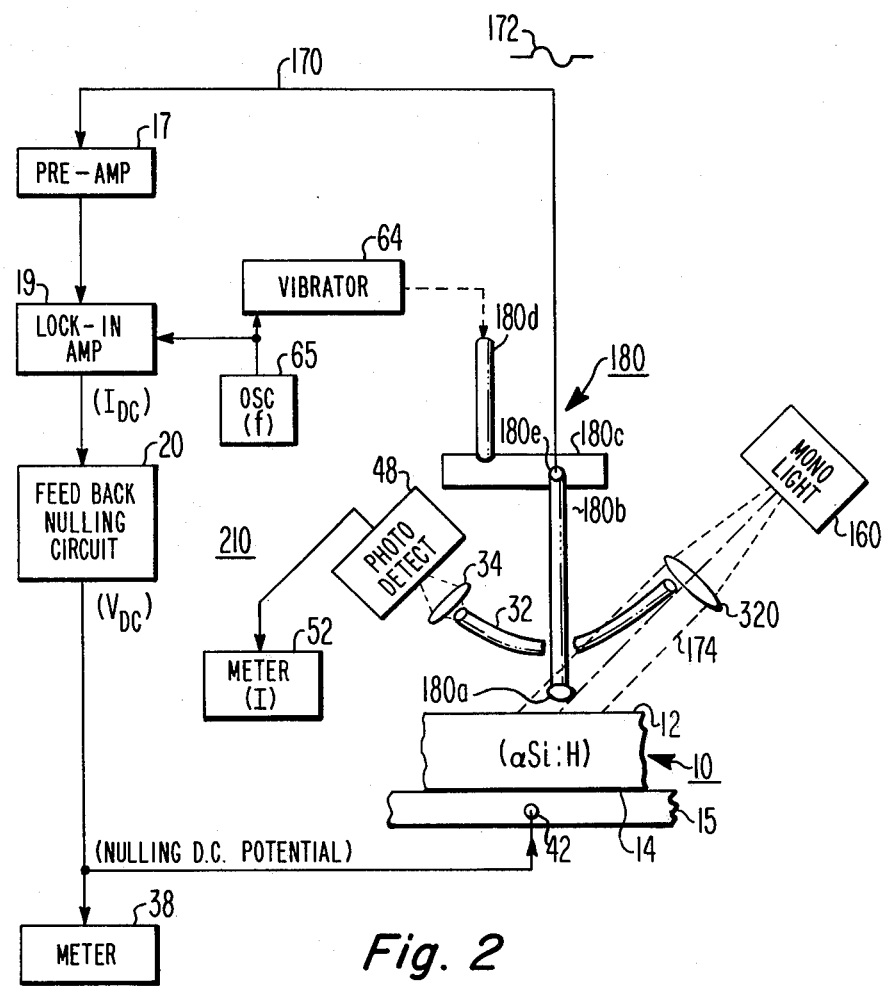
FIG. 2 is a simplified schematic of the elements in general used in practicing the measurement method of the invention.

The measuring apparatus of the invention as illustrated in FIG. 2, to be described, provides a means using a modified version of the constant-magnitude surface photovoltage (SPV) method for determining the minority carrier diffusion length (L) in a semiconductor formed of the type that will be defined. In the embodiment to be described, the wafer for which the diffusion length is to be measured is a layer of hydrogenated amorphous silicon ($\alpha$Si:H). Nevertheless, the invention, it is to be understood, can be used to determine the diffusion length of minority carriers in semiconductor materials other than those in which the diffusion length is significantly small, provided the thickness of the semiconductor material wafer being tested is at least greater than the diffusion length of the minority carrier and preferably four times that diffusion length. Such semiconductor material includes, but is not necessarily limited to, silicon, germanium, gallium arsenide indium phosphide as well as amorphous semiconductor material.

Figure 1:
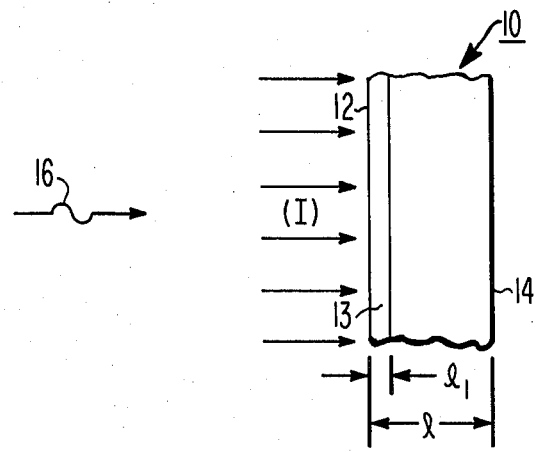
FIG. 1 is a schematic illustrating the geometric parameters of a semiconductor specimen useful in understanding and practicing the invention.

The geometry of a specimen wafer 10 is illustrated in FIG. 1. Wafer 10 is assumed to be in the form of a semiconductor slab having a thickness l formed in the embodiments to be described of hydrogenated amorphous silicon. One surface 12 is uniformly illuminated by a steady d.c. monochromatic light 16 from a source of photon energy hu, slightly greater than the band gap ($E_G$) of the semiconductor material, while the opposite surface 14 is kept dark. The flux of the light quanta is represented by I in relative units. Electron hole pairs are produced by the absorbed photons. Some of these pairs diffuse to the illuminated surface 12 where they are separated by the electric field of the depletion or surface-space-charge region 13 having a thickness $l_1$, producing a surface photovoltage (SPV).

The SPV is capacitively coupled to a Kelvin method-type probe 180 shown in FIG. 2 adjacent to the illuminated face 12. The probe 180, when vibrated, serves to couple capacitively an electrical signal derived from the field at the surface 12 to the measuring apparatus. Probe 180 embodies the well known Kelvin principle for sensing surface potentials. See Solid State Physics by Ashcroft et al., Holt, Rinehart and Winston, (1976), pp. 360-362, for an illustration of the use of the Kelvin method. Any suitable probe for deriving a voltage representing the SPV may be used in the practice of this invention. The probe 180 shown in FIG. 2 is a laboratory form while the probe 18 shown in FIGS. 3 and 4 to be described shows a form of the probe useful for manufacturing or production facilities.

Probe 180 is formed of a ball 180a formed of gold about 2 mm in diameter, attached to a stainless steel screw 180b about 1 cm long. An insulator 180c formed of plastic or glass is connected to a steel rod 180d and carries screw 180b. A terminal 180e is connected to a conductor 170 for connecting electrical signals to a preamplifier 17.

Probe 180 is vibrated vertically along its axis by a vibrator 64 of suitable form such as a torque motor. The vibrator is driven at a fixed frequency (f) by an oscillator 65. The frequency f is within the range of 10-10,000 Hz. In the embodiments being described f is 640 Hz. Probe 180 is spaced about 1-4 mm over surface 12 and is vibrated with an amplitude of about 0.5 mm. Moreover, the beam 174 should illuminate the surface 12 via lens 320, for example, over a substantial area greater than the projected area of the probe ball 180a to reduce illumination edge effects. A voltage signal 172, having a frequency f with a magnitude on the order of 100-200 millivolts, is developed by the probe 180 when vibrated at frequency f and is applied via path 170 to the preamplifier 17. This voltage 172 represents the SPV of wafer 10, after illumination, in ac form.

Amplified voltage 172 is then applied to a lock-in amplifier 19 which provides a d.c. current output serving as an error signal to a feedback potential nulling circuit 20. Lock-in amplifier 19 is operated by a signal at a frequency f from source 65. Source 65 may provide a signal at a selected frequency within the range of 10-10,000 Hz. Accordingly, amplifier 19 is phase and frequency locked to voltage 172. Feedback circuit 20 functions to null the error signal with a nulling potential equal to the d.c. SPV potential of the illuminated wafer 10. Circuit 20 is a suitable operational amplifier arranged to provide a d.c. potential output in response to the d.c. current input from lock-in amplifier 19. This potential is applied to terminal 42 of conductive substrate 15 and thus to the bottom surface 14 of wafer 10. The nulling potential tends to reduce the error signal towards zero. The magnitude of the nulling potential can be measured by a meter 38. The measured potential is equal and opposite to the SPV.

The intensity of light source 160 should be sufficient to develop an appreciable SPV on surface 12 and yet not be so great as to saturate the bending of the energy bands. For amorphous silicon, band bending saturation occurs for SPV values at about 300 millivolts.

Figure 3:
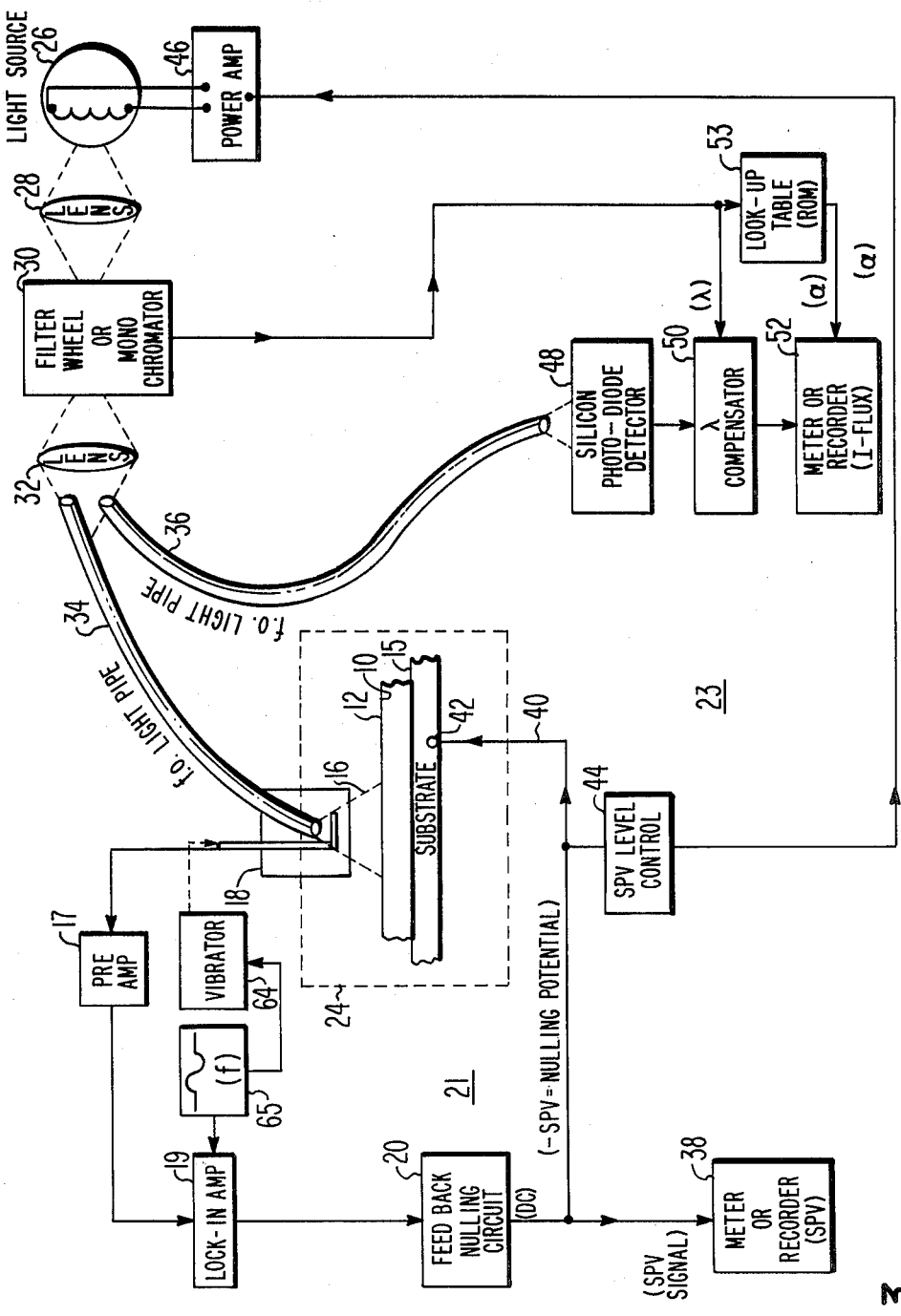
FIG. 3 is a block schematic of the preferred form of apparatus useful in practicing the invention.

A portion of the light from the source 160 is used to provide an indication of the quantum of flux (I) illuminating the surface 12 via a light pipe 32 suitably positioned in the light beam 174. Light can be, in the alternative, sampled by positioning a half-silvered mirror in the beam 174 to pass a portion of the light to the surface 12 and reflect a portion of the light to a detector, such as a photodiode detector 48. Photodetector 48, responsive to the sampled light via light pipe 32 and lens 34, provides such an indication as measured by I-meter 52. Suitable calibration of the flux I reading is needed to compensate for the wavelength dependent response of the detector 48 for each different wavelength of light source 160 used for the measurements. In practicing the invention in the laboratory, the wavelength compensation is done by calculation. In practical application apparatus is provided to automatically compensate for wavelengths as illustrated in FIG. 3 to be described.

As explained in greater detail in the above patent application of A. M. Goodman, the value of the surface photovoltage (SPV) is used to determine the diffusion length L at a given wavelength of light.

Figure 5:
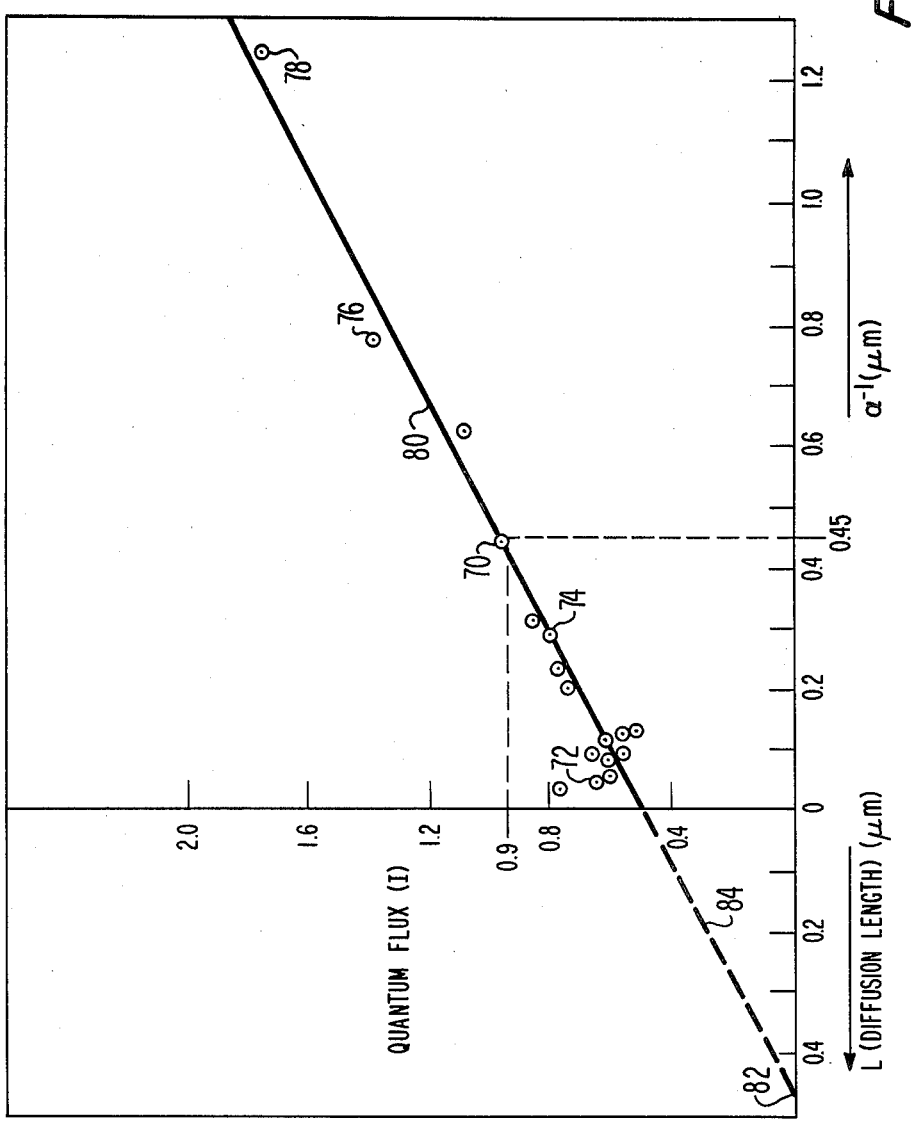
FIG. 5 is a plot of the quantum flux I versus the reciprocal of the absorption coefficient.

The magnitude of the SPV depends on both the optical absorption coefficient $\alpha(\text{cm}^{-1})$ and the photon flux I (photons $-\text{cm}^{-2}-\text{sec}^{-1}$). A series of different wavelength ($\lambda$) values is selected to give different values of the absorption coefficient. At each value of the wavelength $\lambda$, the flux I is adjusted to give the same value of the SPV, that is, a constant magnitude of the SPV. If I is plotted against the reciprocal of the absorption coefficient ($\alpha^{-1}$) for each of these constant magnitude SPV points, the result is a linear graph whose extrapolated intercept on the negative reciprocal absorption coefficient axis is the effective diffusion length (L). An example of such a graph is illustrated in FIG. 5 to be described further hereinafter. The thickness of the material l must be much greater than the diffusion length L. In practice, a material thickness (l) of at least four times the diffusion length (L) is preferred although the invention provides practical measurements for material of thicknesses between two and four times L.

In the operation of the apparatus shown in FIG. 2, light from source 160 at a first predetermined wavelength illuminates surface 12 while vibrator 64 causes probe 180 to be oscillated or vibrated along its vertical axis over the surface 12. The alternating voltage signal 172 is derived from the SPV developed by the light. The signal 172 is coupled to preamplifier 17, providing an amplified version of signal 172 which in turn is applied to lock-in amplifier 19 serving essentially as a synchronous detector which is gated by an oscillating signal at frequency f from oscillator 65. The signal from oscillator 65 also actuates vibrator 64 for oscillating the probe 180. Accordingly, the probe 180 and the lock-in amplifier 19 are frequency and phase locked. Amplifier 19 provides a d.c. current representing the magnitude of the derived SPV voltage 172. This serves as the error signal of a feedback loop 210 formed of the probe 180, pre-amp 17, amplifier 19, and nulling circuit 20. The error signal from amplifier 19 is applied to the feedback nulling circuit 20 which provides a voltage potential proportional to the error input signal. Nulling circuit 20 is suitably an operational amplifier having a high input impedance and a low output impedance for coupling a nulling potential to the substrate 15. The output signal of circuit 20 is a nulling d.c. potential which, when applied to terminal 42 of substrate 15, tends to oppose the SPV potential developed in the wafer 10. When the magnitude of the nulling d.c. potential applied to terminal 42 is equal and opposite to the SPV, the loop 210 will have reduced the error signal from amplifier 19 to zero. The meter 38 indicates the magnitude of this nulling potential which is equal to the magnitude of the SPV.

A series of tests at different wavelengths of light source 160 are performed in a similar manner. Thus, a second wavelength is selected for light source 160 to illuminate the surface 12. The circuit operates to provide a reading of meter 38 indicative of the SPV. In order to make the series of tests complying with the constant SPV requirement explained above, the intensity of light source 160 for each wavelength is adjusted until the meter 38 displays a magnitude of the nulling potential that is equal to the SPV value of the first measurement at the first selected wavelength. A series of such illumination steps at different wavelengths are repeated to provide a fair number of sample points of the type indicated by points 72, 74, 76 and 78 illustrated in FIG. 5. Each sample point is referenced to FIG. 5 by the quantum flux (I) needed to develop the constant SPV value. This flux value is determined by meter 52 providing a display of the sampled light detected by photodetector 48.

For each point to be plotted as illustrated by FIG. 5, the absorption coefficient $\alpha$ is determined from the respective wavelengths of light used for each test point. These points are then plotted as shown in FIG. 5. For example, for point 70 for a quantum flux I of 0.9, the absorption coefficient for the wavelength of the light is approximately 0.45. A plurality of such test points are plotted and a line 80 is drawn as indicated to extend into the negative axis which, as known, and explained above represents the diffusion length L in micrometers. In the example illustrated, the intersection point 82 indicates a diffusion length L equal to 0.41 micrometers for the particular specimen of amorphous silicon tested.

Figure 4:
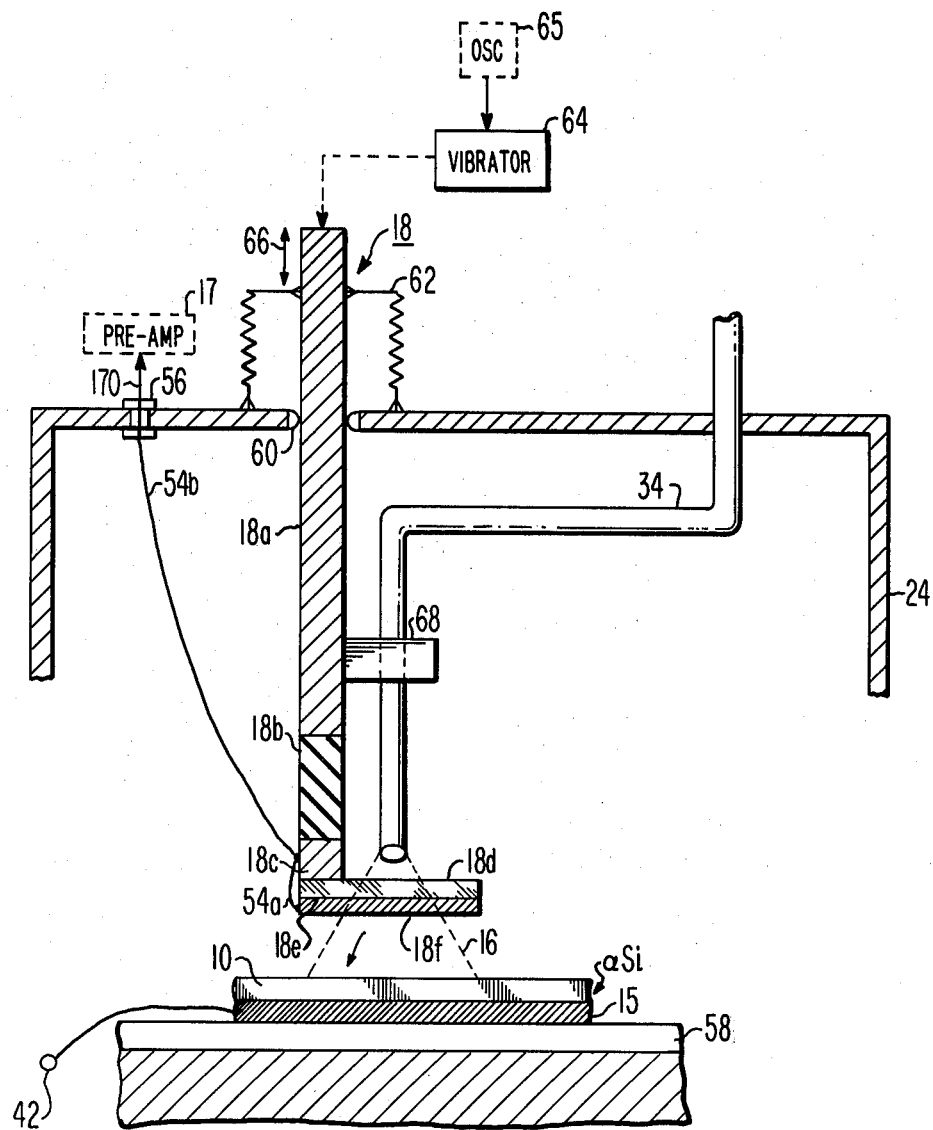
FIG. 4 is a schematic in fragmentary form of a portion of the apparatus of FIG. 3.

While the apparatus illustrated in FIG. 2 is suitable to practice the invention in laboratory or limited manufacturing operations, it is desirable that the apparatus be arranged for manufacturing use. Such an apparatus is illustrated in FIG. 3. The feedback loop 21 portion of FIG. 3 is essentially the same as feedback loop portion 210 of FIG. 2. The apparatus of FIG. 3 provides for a different form of probe to use light via fiber optics. Moreover, FIG. 3 provides for automatic feedback means to adjust the light intensity to maintain the SPV constant as well as an automatic feedback means to null the error signal. An enlarged more detailed portion of FIG. 3 illustrating the surface voltage sensing means is illustrated in FIG. 4.

A beam of polychromatic light from a source of light 26 is passed through a first lens 28, a filter wheel or monochromator 30 and a second lens 32 to a first fiber optic light pipe 34 and a second fiber optic light pipe 36. The monochromatic light from pipe 34 provides the illuminating light 16 applied to the surface 12 of the sample 10 mounted on substrate 15. Another Kelvin method-type probe 18, shown in greater detail in FIG. 4 to be described, responding to the surface voltage generated at the surface 12 of the sample 10 provides a voltage input first to a pre-amplifier 17 and then to lock-in amplifier 19. Amplifier 19 is coupled to feedback nulling circuit 20 providing the nulling potential signal to a meter or recorder 38. The nulling potential is coupled back in the feedback loop 21 via lead 40 to the substrate 15 at terminal 42. The nulling potential is also applied to a SPV level control 44 which provides in a feedback control loop 23 a control signal to a power amplifier 46. Power amplifier 46 is a source of variable d.c. voltage that is controlled by level control 44 to provide a particular d.c. voltage to light source 26 so as to provide light beam 16 at an intensity to provide a constant SPV for each selected wavelength of monochromatic light.

The monochromatic light carried by pipe 36 is applied to a photodetector 48, which in turn provides a signal to a wavelength compensator 50. A control signal representing the selected wavelength from the filter wheel or monochromator 30 is coupled to the compensator 50. Wavelength compensator 50 provides a signal to a meter or recorder 52 representing the wavelength compensated flux I. The wavelength signal is also applied to a look-up-table such as a read only memory (ROM) 53 which, in response to the wavelength signal, provides a signal representing the coefficient $\alpha$. The $\alpha$ signal is then applied to the meter or recorder 52 to provide a flux (I) value plotted against the coefficient $\alpha$ for each selected wavelength.

Filter wheel or monochromator 30, in general, may be of the prism type or grating type. The grating type is preferred, as explained in the above-mentioned application of A. M. Goodman. Wavelength compensator 50 functions to compensate for the wavelength dependent response characteristic of the photodetector 48 due to different wavelengths, as explained in the Goodman application.

Before describing the operation of the apparatus of FIG. 3, reference is made to FIG. 4 for a further description of the details of the sensing mechanism of the surface voltage. The Kelvin probe 18 is formed of a rod of metal 18a having an end piece of insulation 18b and a metallic tip 18c. A transparent plate 18d of glass or quartz is connected to the metal tip 18c. The bottom face 18e of plate 18d is provided with a transparent conducting surface 18f of thin metal. The surface 18f is connected to the probe tip 18c by wire 54a and thence, via conducting wire 54b, through a sealed aperture 56 for coupling the SPV to preamp 17 and thence as seen in FIG. 3 to lock-in amplifier 19. The specimen wafer 10 is supported on conducting substrate 15 which in turn is supported on an insulator support base 58. The wafer is contained in a housing 24 at either vacuum or low pressures, as desired.

In practice, the invention may be used in the fabrication or manufacture of solar cell wafers. Accordingly, in such uses the probe can be housed in the same chamber as the processing apparatus with suitable arrangements to position the probe 18 over the wafer when desired. Kelvin probe 18 is mounted for reciprocal movement through the housing 24 at aperture 60 and provided with suitable guides 60a to allow for longitudinal movement. A flexible bellows 62 provides a resilient support of the probe 18 and seals the chamber of housing 24 from the ambient. A vibrator 64 is provided to vibrate the rod 18a of the Kelvin probe 18 in vibratory vertical motions as indicated by arrow 66. A suitable vibration frequency is about 640 Hz but the probe can be vibrated at a suitable frequency within the range of 10 to 10,000 Hz. A clamp 68 for convenience supports the fiber optic pipe 34 which receives light via lens 32 as shown in FIG. 3.

The operation of the apparatus provides a SPV voltage kept constant at each of a plurality of selected wavelengths via monochromator 30 by the electronic servo loop 21 which, in turn, provides a control signal via SPV level control 44 to vary the intensity of the lamp 26 by varying the output of power amplifier 46. The light is carried via pipe 34 to the sample surface 12 by passing through the transparent plate 18d. The surface-photovoltage (SPV) generated on the surface 12 of sample 10 is sensed by the vibrating Kelvin probe 18. The varying capacitance effected by probe 18 serves to couple the surface-photovoltage (SPV) to the lock-in amplifier 19 via pre-amp 17.

The amplifier 19 provides a d.c. current representing the error signal to feedback nulling circuit 20. Nulling circuit 20 responds to this d.c. current to generate a voltage of equal and opposite polarity to the potential. The negative-polarity nulling SPV is then applied via feedback path 40 to the substrate 15 carrying the wafer 10. Accordingly, the feedback loop 21 nulls the error signal with a nulling potential equal to the SPV voltage of the wafer 10. Moreover, the nulling potential from circuit 20 is applied to a meter or recorder 38 to indicate the magnitude of the SPV. It is this SPV which is kept constant for each of the plurality data points needed to determine L.

Light source 26 also provides light, via light pipe 36, to photodetector 48 which in turn after being wavelength compensated by compensator 50, at the selected wavelength of the monochromator 30, provides a compensated signal representing the flux I to meter or recorder 52. The absorption coefficient $\alpha$ can be determined by calculation or from a look-up table for each wavelength of incident light used to develop the SPV. In the alternative, the coefficient $\alpha$ can be provided automatically by a ROM 53 arranged to convert the wavelength to the coefficient $\alpha$ and provide a control signal to the meter or recorder 52. Recorder 52 then plots the data points 72,74 etc. (FIG. 5) needed to determine L.

The determination of L is made by the flux I (according to meter 52) being plotted on a graph as illustrated in FIG. 5, assuming that the specimen 10, identical to that tested on the apparatus of FIG. 2 described above, has a flux value of 0.9. Point 70 is plotted against, for example, a look-up table value of 0.45 $\mu$m for the reciprocal absorption coefficient of amorphous silicon at the particular optical wavelength.

A plurality of such plots are made manually or automatically for each of a group of selected wavelengths as indicated by the plotted points 72, 74, 76, 78, etc. Each of such measurements provides a flux I which value is plotted as shown for each of the points. For example, a measurement for the wavelength of the largest reciprocal absorption coefficient and flux I is represented by plotted point 78. During the measurement of each different wavelength resulting in a different flux I, the preselected d.c. SPV is kept to a substantially constant value by manually adjusting the intensity of light source 160 (as for FIG. 2) or by the servo 23 of FIG. 3 and displayed by the meter or recorder 38.

Furthermore, since the measurements at each of the selected wavelengths can be made rapidly in sequence, the effect of SPV drifting is reduced, if not minimized. In practice, a drift in the value of the light intensity I indicated by meter 52 necessary to maintain a constant magnitude SPV (as measured by meter 38) at a given wavelength should not be allowed to vary by more than about 3%. Possible inaccurate determinations of the diffusion length (L) may result if this drift value is exceeded. Such conditions may result from poor preparation of the semiconductor surface, as described in the Goodman application. Nevertheless, the magnitude of SPVs generated by using a constant illumination according to this invention, rather than chopped or modulated illumination, is substantially larger than the magnitude of the portion of the SPV that is affected by drift. Accordingly, our experiments have indicated very little if any drift effects.

Referring again to the determination of L, a line 80 is drawn through the plotted measurement points 72 ... 78 and extended to the abscissa intersection point 82, as by the extended dotted line 84. The abscissa represents in this negative portion of the graph, the diffusion length L in micrometers. The value of 0.41 $\mu$m is determined for this exemplary plot similar to that explained for FIG. 2. In a similar manner the diffusion length L for other specimens of amorphous silicon can be determined.

It has been shown by our experimental conditions that the relation of $\alpha$ and I can be simply related by the expression $$I = K(1\alpha + L) \tag{1}$$

where K is a constant and $\alpha$ and L are as described hereinabove and as plotted in FIG. 5. Equation (1) can be used to determine L by calculation, or, if desired, used to program a simple computer arranged in FIG. 3 to replace the meter or recorder 52.

It will now be appreciated that the invention provides an apparatus and method for determining the diffusion length L of minority carriers in semiconductor material having significantly small diffusion lengths. Such material is typically amorphous silicon including hydrogenated amorphous silicon of the type used in the fabrication of solar photovoltaic devices.

While the invention is advantageously useful in determining the diffusion length of the minority carriers of amorphous silicon because such lengths are so small and, moreover, because of the very slow SPV transients, the invention is useful in general for determining the minority carrier length of any semiconductor material regardless of the magnitude of the diffusion length or the response time. The choice of whether to use the so-called chopped light technique described in the aforementioned patent application of A. M. Goodman, or the techniques disclosed hereinabove (what may be termed the d.c. light technique) depends on the conditions of use.

What is claimed is:

1. An apparatus for determining the minority carrier diffusion length of a sample of semiconductor material, the sample having two major surfaces, one of the surfaces arranged for illumination and the other surface shielded from illumination comprising:

(a) means for illuminating a portion of the one major surface of the sample with steady d.c. monochromatic light that is of a selected wavelength to provide a d.c. surface photovoltage (d.c. SPV);

(b) vibrating means positioned adjacent said illuminated surface for providing an alternating electrical signal representing said d.c. SPV on the sample;

(c) electronic servo means responsive to said alternating electrical signal for automatically providing a nulling potential equal to said d.c. SPV; and (d) means for providing a signal representing the illumination incident upon the sample by detecting a portion of said illuminating light.

2. The apparatus according to claim 1, wherein said semiconductor material is amorphous silicon and wherein said light has a wavelength within the range of 4000 to 7000 angstroms.

3. The apparatus according to claim 1, wherein said modulated electrical signal means includes a probe having capacitance and arranged to vibrate over said illuminated surface to provide an alternating signal representing said SPV.

4. The apparatus of claim 1, wherein said modulated electrical signal means includes a Kelvin method-type probe positioned over said illuminated surface area and arranged to vibrate at a frequency within the range of about 10–10,000 Hz to provide an alternating signal representing the SPV.

5. The apparatus of claims 3 or 4, wherein said nulling means is included in a servo loop for automatically adjusting the intensity of the illuminating means at a given wavelength to generate said SPV to a substantially constant value, and means to indicate the intensity of said illuminating light.

6. A method for determining the minority carrier diffusion length of a sample of semiconductor material, the sample having two major surfaces, one of the surfaces arranged for illumination and the other surface shielded from illumination including the steps of:

(a) illuminating a portion of the one major surface of the same with steady d.c. monochromatic light that is of a selected wavelength to provide a d.c. surface photovoltage (d.c. SPV);

(b) vibrating a probe adjacent said illuminated surface to provide an alternating signal representing said d.c. SPV;

(c) providing in an electronic servo means a nulling potential equal to said d.c. SPV in response to said alternating electric signal; and (d) providing a signal representing the illuminating intensity incident upon the sample by detecting a portion of said illuminating light.

7. A method according to claim 6, wherein the representative SPV signal is provided by positioning in the path of the light a transparent capacitive pickup electrode spaced from the illuminated surface of the sample, vibrating the electrode over the surface, an alternating signal representing the SPV appearing between the transparent electrode and the surface.

8. A method according to claim 6, comprising the step of selecting the wavelength of light with a monochromator.

9. A method according to claim 6, including the step of adjusting the intensity of the illuminating light to generate a predetermined magnitude of SPV signal.

10. A method according to claim 9, further including the step of automatically adjusting the intensity of the illuminating light at a given wavelength in an electronic servo loop in response to the SPV generated on the illuminated surface of the sample to maintain the SPV to a substantially constant value.

11. A method according to claim 10, further including the step of providing in the servo loop a control signal having a magnitude and polarity to compensate for changes in the SPV signal from a predetermined value, and using the control voltage to control the intensity of the illuminating light.

12. A method according to claim 6, further including the step of detecting a portion of the light at a given wavelength to generate an electrical signal representing the photon flux illuminating the sample.

13. A method according to claim 12, further including the step of compensating at each selected wavelength of the illuminating monochromatic light for the response characteristic of the detector that is wavelength dependent.

* * * * *